United States Patent [19]

Marley, Jr. et al.

[11] 3,928,081

[45] Dec. 23, 1975

[54] METHOD FOR FABRICATING SEMICONDUCTOR DEVICES USING COMPOSITE MASK AND ION IMPLANTATION

[75] Inventors: James A. Marley, Jr., Saratoga; Bohumil Polata, Los Altos, both of Calif.

[73] Assignee: Signetics Corporation, Sunnyvale, Calif.

[22] Filed: Oct. 26, 1973

[21] Appl. No.: 409,903

[52] U.S. Cl. .................... 148/1.5; 148/33; 148/187

[51] Int. Cl.² ........................................ H01L 7/44

[58] Field of Search ............... 148/1.5, 33, 187, 175

[56] References Cited

UNITED STATES PATENTS 3,791,885 2/1974 Merchant ........................... 148/187

*Primary Examiner*—Peter D. Rosenberg

*Attorney, Agent, or Firm*—Flehr, Hohbach, Test, Albritton & Herbert

[57] ABSTRACT

A method for fabricating semiconductor devices from a semiconductor body having a planar surface by forming on the surface a layer of protective material which is to be utilized as a mask. A plurality of windows are formed simultaneously in the layer of protective material to expose said surface to permit the subsequent formation of isolation regions, base regions and collector contact regions in the semiconductor body. Ion implantation is carried out at low temperatures through certain of the openings while covering the other openings to form the respective regions thereby eliminating the necessity for mask to mask tolerance requirements and tolerances required for thermal diffusions.

17 Claims, 8 Drawing Figures

METHOD FOR FABRICATING SEMICONDUCTOR DEVICES USING COMPOSITE MASK AND ION IMPLANTATION

BACKGROUND OF THE INVENTION

This invention relates to the method for fabricating semiconductor devices utilizing composite masking. Heretofore it has been the practice to utilize separate masks for forming separate openings in the silicon dioxide layer utilized as a diffusion mask on semiconductor devices. When such has been the case it has been necessary to provide for misalignment tolerances. In order to make possible devices having smaller geometries with standard mask tolerances, it is necessary to provide a method whereby such misalignment tolerances can be eliminated.

SUMMARY OF THE INVENTION AND OBJECTS

The method for fabricating semiconductor devices from a semiconductor body having a planar surface comprises the steps of forming a layer of material to be utilized as a mask on the surface. A plurality of windows are formed simultaneously in the layer of material exposing the surface to permit the subsequent formation of diffusion isolation regions, base regions and collector contact regions in the semiconductor body. The areas are doped in a predetermined sequence while covering the areas also in a predetermined sequence without the removal of said layer of material from said surface to provide the diffusion isolation regions, the base region and collector contact region and an emitter region. Contacts are then formed on the layer of material and extend through the same to make contact with the base and emitter regions and the collector contact region.

In general, it is an object of the present invention to provide a method for fabricating semiconductor devices in which a composite mask is utilized to reduce misalignment tolerances by defining critical geometries on a single mask.

Another object of the invention is to provide a method of the above character in which selected areas are sequentially doped while covering other areas to prevent doping of the same until a predetermined time in the sequence.

Another object of the invention is to provide a method of the above character in which the areas which are not to be doped can be covered in non-critical alignment steps.

Another object of the invention is to provide a method of the above character which makes it possible to substantially reduce the top surface area required for fabrication of a semiconductor device.

Another object of the invention is to provide a method of the above character in which the devices are smaller and have reduced parasitic capacitance.

Another object of the invention is to provide a method of the above character in which the openings which have been formed can be covered by a suitable protective material such as photoresist or a metal in a non-critical alignment step and which can be removed after doping of a previous area and before thermal diffusion and/or annealing.

Additional and further objects of the invention will appear from the following description in which the preferred embodiments are set forth in detail in conjunction with the following description and drawings.

DESCRIPTION OF THE PREFERRED EMBODIMENT

Figure 1:
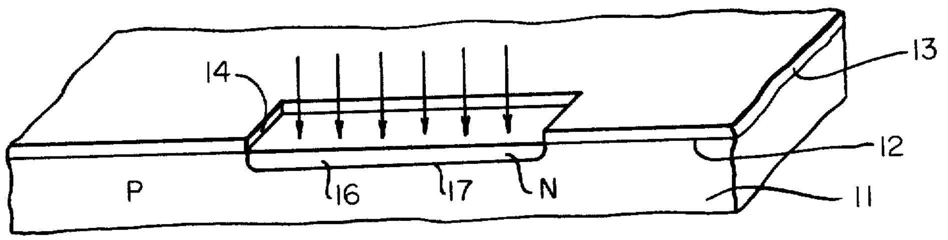
FIGS. 1 through 8 are cross sectional views, certain of which are isometric, illustrating the steps utilized in the method incorporating the present invention.

The method for fabricating a semiconductor device utilizing ion implantation is shown in FIGS. 1 through 8. As shown in FIG. 1, a semiconductor body 11 is taken which has a planar upper surface 12. The semiconductor body is of a conventional type as, for example, having a resistivity from 8 to 26 ohm centimeter and of the P type. The semiconductor body 11 is used as a starting substrate. A protective layer 13 of a suitable material such a silicon dioxide is grown on the surface 12 to the desired thickness which need not be greater than one half a micron. Normally in the case of ion implantation the insulating layer 13 can have a thickness which is formed by one half to three hours of oxidation at 1145°C.

Openings or holes 14 are formed in the protective layer 13 by suitable conventional photolithographic techniques. As can be seen from FIG. 1, the openings 14 have a rectangular geometry. The silicon dioxide layer 13 serves as a mask to prevent the arsenic from being implanted in the other areas of the surface 12. This arsenic impurity is then diffused to a greater depth as, for example, 3–4 microns to provide a region 16 which serves as a buried layer. This buried layer of the N-type impurity is defined by generally dish-shaped PN juncion 17 which extends to the surface 12. Because the initial depositing of the impurity into the substrate through the windows 14 was accompanied by ion implantation, there is reduced side diffusion of the buried layer 16 as, for example, less than approximately 1 micron so that the buried layer has been formed with great precision. Thus, the use of ion implantation in this step makes possible the formation of a buried layer of relatively precise dimensions. Another advantage of ion implantation for this step is that the peak of the concentration of the impurity is somewhat below the surface 12. Conversely when the deposition is carried out by thermal diffusion, the maximum concentration is at the surface 12 which creates the undesirable characteristic of increased out diffusion during subsequent steps. Thus it can be seen that by utilizing ion implanted arsenic, the quality of the subsequently deposited epitaxial material is higher because of fewer metallurgical defects propagated from the buried layer into the epitaxial layer.

Thus, it can also be seen that the ion implantation and subsequent thermal diffusion of the buried layer avoids the necessity of forming the buried layer by thermal deposition which is a troublesome process because of the relatively high temperature, i.e. 1295°C and the length of time, i.e. 5 hours for the formation of the buried layer. This also helps to reduce metallurgical defects which often are created by such high temperature processing.

After the buried layer has been formed, the oxide layer 13 is removed by conventional etching techniques and thereafter an epitaxial layer 18 is formed on the surface 12 in a conventional manner to a thickness ranging from 4–5 microns. However, it should be appreciated that with respect to certain very fast circuits it may be desirable to decrease this thickness to 2–3 microns. An upper surface 19 is provided by the epitaxial layer 18. A layer 21 of silicon oxide of a suitable thickness as, for example, 1 micron or 8000 Angstroms, is grown on the surface 19. It should be pointed out that this oxide layer 21 is grown very precisely so that the oxide will serve as a stopping mask for the following implantation steps. By way of example, this thickness can range from 7000 to 9000 Angstroms.

Figure 2:
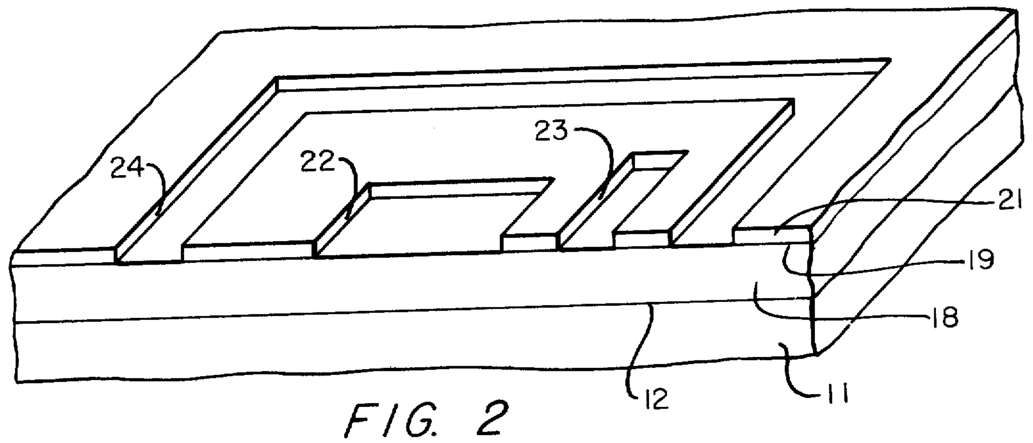

After formation of the layer 21 having a precise thickness, conventional photolithographic techniques are utilized to form three windows 22, 23 and 24 simultaneously with the window 22 being for the base region, window 23 being for the collector contact or plug region and window 24 being for the diffusion isolation region. As can be seen in FIG. 2 a rectangular geometry is utilized. As hereinafter explained, by forming all three windows by the use of a single composite mask rather than two or three masks, the mask-to-mask tolerances which presently total approximately 3 microns are eliminated.

Figure 3:
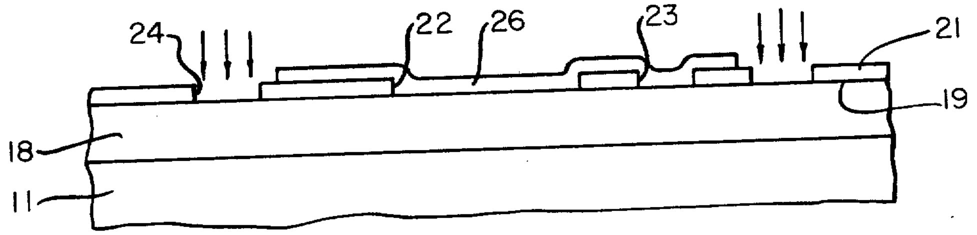
Figure 4:
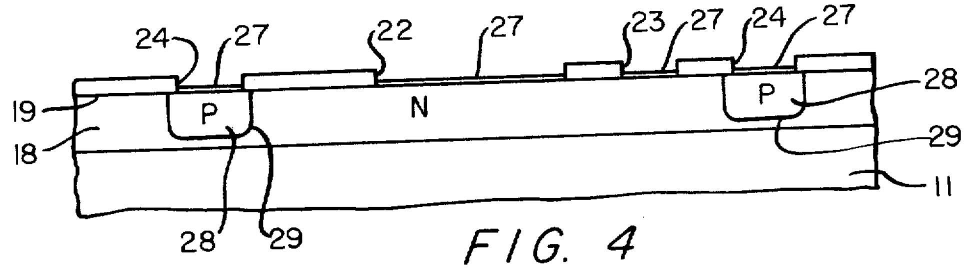

After the windows 22, 23 and 24 have been formed, a suitable protective material such as a metal or photoresist is deposited over the top surface of the structure shown in FIG. 2 to provide a layer 26 which overlies the silicon dioxide layer 21 and extends into the windows 22, 23 and 24. A mask is then utilized with conventional photolithographic techniques to remove the undesired portions of the layer 26 from certain areas as, for example, from the isolation windows 24 as shown in FIG. 3 so that the layer only covers the base window 22 and the collector contact or plug window 23. It will be noted that the mask is of such a size so that there is approximately 3 microns of tolerance from the edge of the window 24. This is sufficient because the alignment at this stage is not critical. Ion implantation is then utilized to implant the desired impurity into the surface 19 exposed by the isolation window 24. Implantation is carried out at a suitable voltage such as 150 Kev. In such a case, the oxide layer 21 and the layer 26 need only have a thickness of approximately 0.8 to 1 micron to be sufficient to stop the ion beam. Photoresist of this thickness also can be utilized if desired for the material of layer 26. Aluminum or other suitable protective material would be a very satisfactory metal.

After the ion implantation step has been carried out, the layer 26 is stripped and the wafers are cleaned of any photoresist residue. Thereafter, a diffusion step is carried out to diffuse inwardly the impurities which have been ion implanted in exposed portions of the surface 19. The diffusion is accomplished by providing a very thin controlled oxide layer in the windows 22, 23 and 24 on the surface 19 by a dry oxidation process and then heating the semiconductor structure shown in FIG. 4 in a dry atmosphere at a sufficient temperature for a sufficient period of time to drive the implanted boron downwardly to form P+ regions 28 which are defined by dish-shaped junctions 29 extending to the surface 19. The regions 28 are driven to such a depth so that the regions 28 almost extend down to the substrate 11 through the epitaxial layer 18 so that when the final processing is completed the regions 28 will extend all the way down to the substrate 11 to provide isolated islands. Because ion implantation has been utilized for initially implanting the boron, the side diffusion is considerably lessened. The sidewise diffusion is also lowered by the fact that by utilizing ion implantation, the amount of impurity which is implanted is just enough to provide the desired isolation with no substantial excess. This is also then advantageous because it reduces the capacitive coupling in the circuit. Thus, by using ion implantation for the isolation, it is possible to reduce the tolerance required between the base and the isolation, in addition to the self-alignment feature of the openings as hereinbefore described. By way of example, the boron was implanted to a depth of approximately 1 micron and then diffused to a depth of 2–3 microns. The side diffusion is only approximately two thirds of this latter value.

Figure 5:
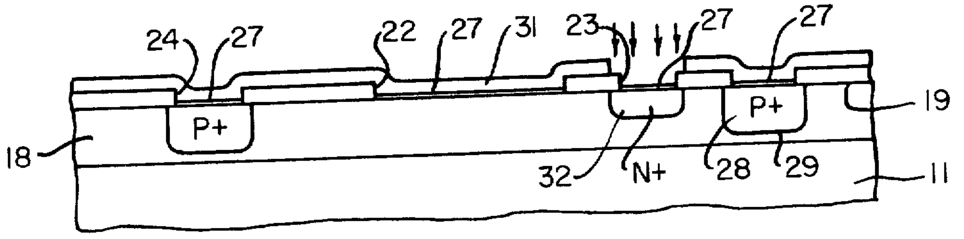
Figure 6:
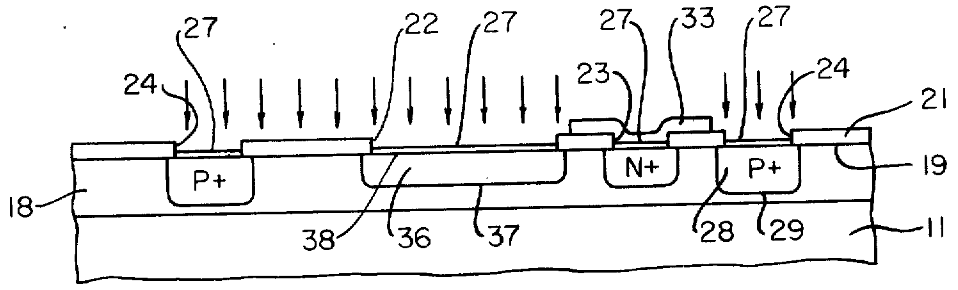
Figure 7:
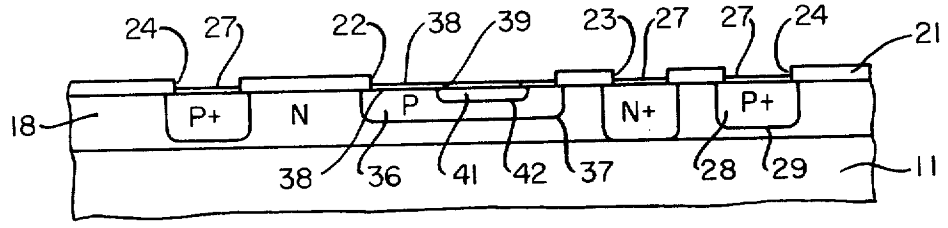
Figure 8:
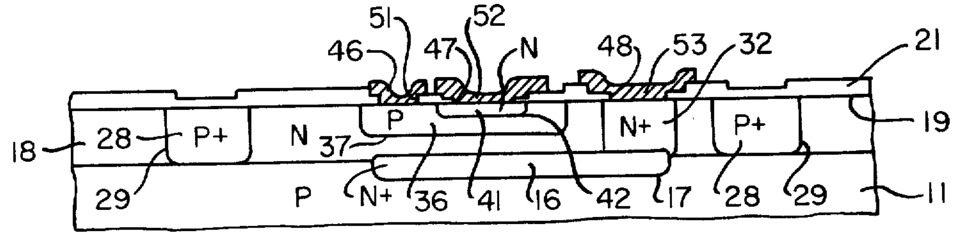

After the isolation diffusion has been completed, a layer 31 of a suitable protective material such as photoresist is formed over the surface of the oxide layer 21 and into the openings 22, 23 and 24. Utilizing a mask in conventional photolithographic techniques, the photoresist is removed in the region of the collector contact or plug and the window 23 with approximately a 3 micron clearance. If desired, the thin oxide layer 27 in the window 23 can also be removed. However, this is not necessary because implantation can be carried out through this relatively thin layer. The desired N-type impurity such as phosphorus can be implanted directly through the thin layer 27 in the openings 24 to form the N+ collector plug or contact region. The thin layer 27 serves to provide a cap for stopping the phosphorus from escaping after it has been driven into the surface 19. The area in which the phosphorus is implanted is defined by the window 23 which was defined by the original mask. The oxide layer 21 serves as a stopping agent for the ion beam outside of the window 23. Similarly, the photoresist layer 31 serves as a stopping agent in the windows 22 and 24. The ion implantation is carried out to a depth of approximately 1 to 1½ microns. Thereafter, the photoresist layer is stripped and the semiconductor structure is placed initially in a slightly oxidizing atmosphere and then in a non-oxidizing atmosphere such as an inert gas to drive the N-type impurities downwardly to form an N+ region 32 as shown in FIG. 5.

These diffusion steps are carried out at progressively lower temperatures. For example, the isolation diffusion can be carried out at a temperature of 1200°C, the collector plug diffusion can be carried out at 1150°C, and the base diffusion hereinafter described can be carried out at 1100°C. with the effect that each subsequent diffusion step will have a lesser effect upon the preceeding steps. Alternatively, these diffusion steps can be carried out at the same or at different temperatures if the effect of the combined out diffusion at the different temperatures and times are taken into account when calculating the total diffusion depth.

In this connection, it should be noted that with the thinnest type of epitaxial structures, the amount of thermal driving required would be decreased significantly. For example, with a 1½ micron epitaxial layer, ion implantation could be utilized for almost all of the semiconductor structures with very little additional thermal driving. This would be advantageous because this would require significantly less lateral diffusion and make it possible to utilize tighter geometries for the construction of the semiconductor device.

After the thermal driving of the collector plug 32 has been completed, another layer 33 of a suitable material such as photoresist is formed on the oxide layer 21 and in the windows 22, 23 and 24. By utilization of a suitable mask and photolithographic techniques, the undesired photoresist is removed so that there remains photoresist in the window 23 and overlapping the oxide layer surrounding the window 23 by approximately 3 microns. Another ion implantation step is then carried out using a P-type impurity and this impurity is implanted through the thin oxide layer 27 and into the window 22 for the base region and also into the window 24 for the isolation region. Alternatively, the thin oxide layer 27 can be removed by conventional etching techniques so that implantation is driven directly into the surface 19 exposed by the windows 22 and 24. The P+ impurities which are implanted into the regions 38 merely enhance the P+ isolation and, in fact, may help to prevent inversion at the surface. If desired, this latter step can be carried out completely by thermal diffusion if so desired. If carried out by ion implantation, it should be done in a voltage range from 40–60 Kev so as to insure that the base will not be driven to a depth greater than 1–2 microns and preferably only to a depth of approximately 1½ microns to form a base region 36 which is defined by a dish-shaped PN junction 37 extending to the surface. During the time that the base is being diffused inwardly, an oxide layer 38 is being formed in the base window 22 and also in the collector plug window 23. Thereafter by conventional photolithographic techniques and a mask, a window 39 is formed in the thin oxide layer 38 and N-type impurities are then diffused through the opening 39 to form the N-type region 41 (see FIG. 7) defined by a dish-shaped PN junction 42 extending to the surface 19 and being disposed within the PN junction 37. Although this emitter region 41 can be formed by conventional thermal diffusion techniques, it readily can be carried out by the use of ion implantation.

After the emitter 41 has been formed, conventional photolithographic techniques are utilized in conjunction with a contact mask to form a base contact opening 46, and emitter contact opening 47 and a collector contact opening 48. The collector contact opening 48 is oversized so that it overlaps by approximately 3 microns the collector plug 32. Thereafter, a suitable metal such as aluminum is evaporated over the surface of the oxide layer 13 and then the undesired metal is removed by conventional photolithographic techniques so there remains a base contact 51, an emitter contact 52 and a collector contact 53. This completes the basic semiconductor structure. It can be readily appreciated that other types of devices can be fabricated at the same time as, for example, diodes, diffused resistors, etc. to provide an integrated circuit.

In viewing the method herebefore described in fabricating the semiconductor structure, it can be seen that one of the principal differences over that which has been done in the prior art has been the use of a single composite mask in which there are simultaneously formed openings for formation of the diffusion isolation region, the base and the collector plug. This protective mask which has been formed of silicon dioxide on the surface of the semiconductor body at the commencement of fabrication and remains in place and is not removed during the process. It forms part of the final product.

By way of example, in one embodiment of the invention, it was found that the use of the method hereinbefore described makes it possible to reduce the distance between the opening for the base and the opening for the isolation by 4 microns. Another 3 microns is contributed by forming the base and collector openings in the mask simultaneously which eliminates the mask-to-mask tolerance requirements. An additional 1 micron is contributed by the advantage of implanting an impurity to a depth of 1 micron so that the total reduction is 4 microns all around the periphery of the device in the top area. By way of example, a collector plug having conventional dimensions of 47 × 73 microns at the top would be reduced to 39 × 65 microns which is a percentage improvement of approximately 26%.

A specific example is an integrated circuit which has been marketed by Signetics Corporation as a 54H100. This circuit includes a phase splitter having a top area of 77 × 99 microns or a total of 6,930 sq. microns. When the phase spitter is laid out in accordance with the method hereinbefore disclosed, the top area required is 3,726 sq. microns which is a reduction of approximately 46½% in top area.

In addition to saving in area, there are other advantages in utilizing the present invention. Parasitic capacitance is reduced which improves the frequency performance of the device. Also, the yield is improved. By way of example, in a large die the yield could be 30% but for smaller devices the function of yield might increase as much as 65% without changing any other parameters except the size of the devices. This is because there is generally a fixed number of defects per wafer and when the device is smaller, the chances that a defect will be in one of the devices is greatly reduced.

In the fabrication of the devices with the present method, 35 ohm per square material has been utilized with a base of approximately 3 microns in depth. When it is desired to provide higher speed devices it is necessary to make them shallower and in such cases 155 ohms per square material is utilized. It is believed that it will be desirable to increase the resistivity of the base to 200 ohms per square which will make it easier to form the emitter while at the same time saving approximately 50% on the base resistor length. As well known to those skilled in the art, the base diffusion is also utilized for forming resistors. By utilizing a higher resistivity material, the resistors will be reduced in length and this will also save in space. Using these combinations, it is possible to reduce the active area required for devices where resistors and transistors are combined to 60–70% of that previously required.

It is apparent from the foregoing that there has been provided a new and improved method for fabricating a semiconductor device which now greatly reduces the space required for such semiconductor devices and which at the same time gives other improved qualities such as high speed performance and reduced parasitic capacitance. In addition, it can be seen from the foregoing that composite masking has been utilized to reduce misalignment tolerances by defining the critical geometries on a single mask. The initial protective layer on which all critical openings are defined is never removed and forms a part of the completed semiconductor structure. The areas which are exposed by the mask are selectively doped using ion implantation and thermal diffusion while the areas which are not to be doped until later in the sequence are covered by materials utilizing non-critical alignment steps.

We claim:

1. In a method for fabricating semiconductor devices from a semiconductor body having a planar surface, forming a layer of material to be utilized as a mask on said surface, forming substantially simultaneously a plurality of openings in said layer of material exposing said surface, said openings being sized and positioned so that they can be utilized for the formation of a diffusion isolation region, a base region and a collector contact region in the semiconductor body, covering said openings for the formation of the base region and the collector contact region with a material which will prevent impurities from entering said openings for the formation of the base region and the collector contact region, causing impurities to enter the semiconductor body through the opening for the diffusion isolation region so that the impurities will be driven to a substantial depth within the semiconductor body, removing the material covering at least said collector contact region, covering the openings for the diffusion isolation region and the base region, causing impurities to enter the open window for the collector contact region and to penetrate into the semiconductor body to form a collector contact region, removing the material covering at least the opening for said base region, covering at least said opening for the collector contact region with a material through which impurities cannot make a significant penetration, causing an impurity to enter the opening for the base region to define a base region in the semiconductor body, causing an impurity to pass through the opening for the base region to cause the formation of an emitter region within the base region, forming openings in said layer of insulating material exposing portions of said surface overlying the base and emitter regions and the collector contact region and forming a metallic contact extending through said opening and making contact to said base and emitter regions and said collector contact region.

2. A method as in claim 1 wherein said diffusion isolation region is formed by using ion implantation to implant the impurity and then driving the impurity to a greater depth in the semiconductor body by the use of heat.

3. A method as in claim 1 wherein said base region is formed by implanting impurities into the base region by the use of ion implantation and wherein the impurities are driven to a greater depth in the base region by the application of heat.

4. A method as in claim 1 wherein said impurity in the collector contact region is introduced by ion implantation and a subsequent application of heat.

5. A method as in claim 4 wherein said impurity for the emitter region is introduced by ion implantation.

6. A method as in claim 3 wherein additional impurities are introduced into the isolation diffusion region during the time the impurities are being introduced into the base region.

7. A method as in claim 1 wherein the semiconductor body includes an epitaxial layer and wherein said isolation diffusion region, said base and emitter regions and said collector contact region are disposed in the epitaxial layer.

8. A method as in claim 7 together with the step of forming a buried layer in the semiconductor body below the epitaxial layer.

9. A method as in claim 1 wherein said layer of material on said surface to be utilized as a mask is silicon dioxide and wherein said semiconductor body is formed with silicon.

10. A method for fabricating semiconductor devices from a semiconductor body having a planar surface, forming a layer of material to be utilized as a mask on said surface, forming substantially simultaneously a plurality of openings in the layer of material to expose areas of said surface, selectively doping the exposed areas defined by said openings in sequence and selectively covering said openings so that the areas exposed thereby are not doped until the proper time in said sequence.

11. A method as in claim 10 wherein a material which can be readily removed is utilized for selectively covering said openings.

12. A method as in claim 11 wherein said material is a photoresist.

13. A method as in claim 11 wherein said material is a metal.

14. A method as in claim 11 wherein said material covering said openings is selectively removed and subjecting the semiconductor body to heat to cause thermal diffusion of the doped impurities.

15. A method as in claim 10 wherein said areas are doped by the use of ion implantation.

16. A method as in claim 10 wherein said areas are doped by first implanting impurities by use of ion implantation and subsequently driving them to a greater depth in the semiconductor body by thermal diffusion.

17. A method as in claim 11 wherein said openings can be selectively covered by forming said material over said openings so that they substantially overlap said openings in non-critical alignment steps.

* * * * *